(12) United States Patent
Mecklenburg

(10) Patent No.: US 11,935,968 B2
(45) Date of Patent: Mar. 19, 2024

(54) INTEGRATABLE CAPACITOR

(71) Applicant: Arno Mecklenburg, Berlin (DE)

(72) Inventor: Arno Mecklenburg, Berlin (DE)

( * ) Notice: Subject to any disclaimer, the term of this patent is extended or adjusted under 35 U.S.C. 154(b) by 126 days.

(21) Appl. No.: 17/634,811

(22) PCT Filed: Apr. 3, 2020

(86) PCT No.: PCT/EP2020/059657
§ 371 (c)(1),
(2) Date: Feb. 11, 2022

(87) PCT Pub. No.: WO2020/201547
PCT Pub. Date: Oct. 8, 2020

(65) Prior Publication Data
US 2023/0069645 A1    Mar. 2, 2023

(30) Foreign Application Priority Data
Apr. 5, 2019   (DE) ............... 10 2019 002 515.6

(51) Int. Cl.
*H01L 29/92*   (2006.01)
*H01L 29/24*   (2006.01)

(52) U.S. Cl.
CPC ............ *H01L 29/92* (2013.01); *H01L 29/247* (2013.01)

(58) Field of Classification Search
CPC ....... H01L 29/92; H01L 29/247; H01L 28/90; H01L 29/945; H01L 49/02; H01L 29/94;
(Continued)

(56) References Cited

U.S. PATENT DOCUMENTS

2002/0177039 A1* 11/2002 Lu .............. H01B 1/122
205/58
2003/0194853 A1* 10/2003 Jeon .............. H01L 29/513
257/E21.208
(Continued)

FOREIGN PATENT DOCUMENTS

WO     WO 99/25026 A1     5/1999
WO     WO 9925026 A1 *    5/1999

OTHER PUBLICATIONS

Dhong SH et al: "Method of Fabricating a New Multi-Layer Stacked Memory Cell Structure", IP.Com Journal, IP.Com Inc., West Henrietta, NY, US. Jul. 1, 1990, XP013089728.
(Continued)

*Primary Examiner* — Mohammad A Rahman
(74) *Attorney, Agent, or Firm* — Pierce Atwood LLP

(57) ABSTRACT

Capacitor comprising: a first porous semiconductor having an average pore size of between 20 nm and 200 nm and preferably between 40 nm and 100 nm, at least one second electric conductor, wherein the second electric conductor infiltrates the porous structure, and the materials involved are selected such that a potential barrier is formed between the first porous semiconductor and the second conductor, without applying an external voltage, as a result of the diffusion of charge carriers, which is preferably more than 0.5 V, more preferably more than 0.7 V, more preferably more than 1 V, and more preferably still more than 1.4 V, wherein a dielectric layer having a thickness of 1 nm to 10 nm is preferably arranged between the first porous semiconductor and the second electric conductor.

15 Claims, 2 Drawing Sheets

(58) Field of Classification Search
CPC ........ Y02E 60/13; H01G 4/008; H01G 4/012; H01G 4/18; H01G 4/33
See application file for complete search history.

(56) References Cited

U.S. PATENT DOCUMENTS

| | | | |
|---|---|---|---|
| 2010/0225774 A1* | 9/2010 | Enomoto | H01L 27/1464 348/222.1 |
| 2014/0078644 A1* | 3/2014 | Gardner | H01G 11/30 29/25.03 |
| 2014/0183694 A1 | 7/2014 | Gardner et al. | |
| 2018/0203136 A1* | 7/2018 | Liu | G01T 1/241 |
| 2020/0098518 A1* | 3/2020 | Lee | H01G 4/10 |

OTHER PUBLICATIONS

Kestutis Grigoras, Leif Grönberg, Jouni Ahopelto, Mika Prunnila "Integrated TIN coated porous silicon supercapacitor with large capacitance per foot print"; Proceedings vol. 10246, Smart Sensors, Actuators, and MEMS VIII; 102460Z (2017) https://doi.org/10.1117/12.2266603.

* cited by examiner

INTEGRATABLE CAPACITOR

RELATED APPLICATIONS

This application claims priority under 35 U.S.C. 371 to International Application No. PCT/EP2020/059657, filed Apr. 3, 2020, entitled "INTEGRATABLE CAPACITOR", which claims the benefit of priority of German Patent Application No. 102019002515.6, filed Apr. 5, 2019, entitled "INTEGRATABLE CAPACITOR," the entirety of each of which is incorporated herein by reference.

TECHNICAL FIELD

The present invention relates to a capacitor, in particular a capacitor which can be integrated into a monolithic circuit.

BACKGROUND

It would be advantageous for a wide variety of integrated circuits (monolithic circuits) if large electrical capacitances, in particular those with low series resistance, could be integrated therein. This applies in particular—although by no means exclusively—to power applications, and in this case for example to MOSFET and IGBT drivers, including motor controls containing such drivers, wherein integrated capacitances would be advantageous, for example, for buffering the operating voltage and, in the case of high-side drivers, also as so-called bootstrap capacitors. Other possible applications include switching converters of all kinds, from capacitances in resonant converters to charge pumps.

The Technical Research Centre of Finland (VTT) has been working on integrating large capacitances into integrated circuits [1]. The solution proposed by VTT relates to so-called supercapacitors. The idea is to create porous silicon in an integrated circuit by way of (electrochemical) etching using known methods and to stabilise the structure thereof by means of thin, chemical (atomic layer deposition, ALD) TiN deposited from the gas phase; the TiN is applied very evenly on the walls of the pores in the form of conformal layers approximately 10 nm thick. The electrically highly conductive TiN also comes into galvanic contact with the electrically conductive bottoms of the pores. The heterogenous porous material thereby obtained is suitable as electrode material for supercapacitors with a liquid electrolyte. VTT tested 1 M NaCl in water and 0.5 M tetraethylammonium tetrafluoroborate in propylene carbonate. Moreover, the cited publication of VTT includes a method for integrating corresponding supercapacitors into integrated circuits. The approach of VTT has considerable disadvantages, however:

- thermal decomposition and/or comparatively high vapour pressure of the liquid electrolyte as well as the high thermal expansion coefficient of liquids, in this case the liquid electrolyte, compared to conventional solids, make the "VTT capacitors" seem unsuitable for use in components, especially SMD components, which are exposed to high temperatures during soldering;
- a comparatively high internal resistance due to the inherently low electric conductivity of ionic conductors at room temperature, which limits the power output and, depending on the application, can lead to considerable ohmic heat loss in the electrolyte (for example when using the aforementioned capacitors in resonant circuits, which excludes the use thereof as capacitance for resonant converters);
- high temperature dependency of the internal resistance;
- the possible active surface of the silicon is limited by, inter alia, the aspect ratio that can still be shown with the atomic layer deposition of TiN; accordingly, this limits the specific capacitance, and therefore also the energy density, that can be achieved with such capacitors.

[1] Kestutis Grigoras, Leif Grönberg, Jouni Ahopelto, Mika Prunnila: "Integrated TiN-coated porous silicon supercapacitor with large capacitance per foot print"; Proceedings Volume 10246, Smart Sensors, Actuators, and MEMS VIII; 102460Z (2017) https://doi.org/10.1117/12.2266603

SUMMARY

The object of the present invention is to solve the problems set out above.

The present invention achieves the object of providing a capacitor which can be integrated into an IC, in particular integrated into a monolithic circuit, which does not have to contain a liquid electrolyte and which is capable of combining high energy densities with low internal resistances. For embodiments of the invention that are designed for high gravimetric power densities of >100 W/g, for example, a gravimetric energy density of >1 J/g is to be considered high. For embodiments of the invention that are designed for high gravimetric energy densities of >5.4 J/g, for example, power densities of >2 W/g and in particular of more than 5 W/g are to be considered high.

These problems are solved by a capacitor according to claim 1. Preferred embodiments are described in the dependent claims.

Further advantages and further developments of the invention are set out in the following detailed description and in the entirety of the claims. Capacitors according to the invention are in many cases also suitable for advantageously replacing MLCCs.

DESCRIPTION OF THE EMBODIMENTS

Figure 1A:
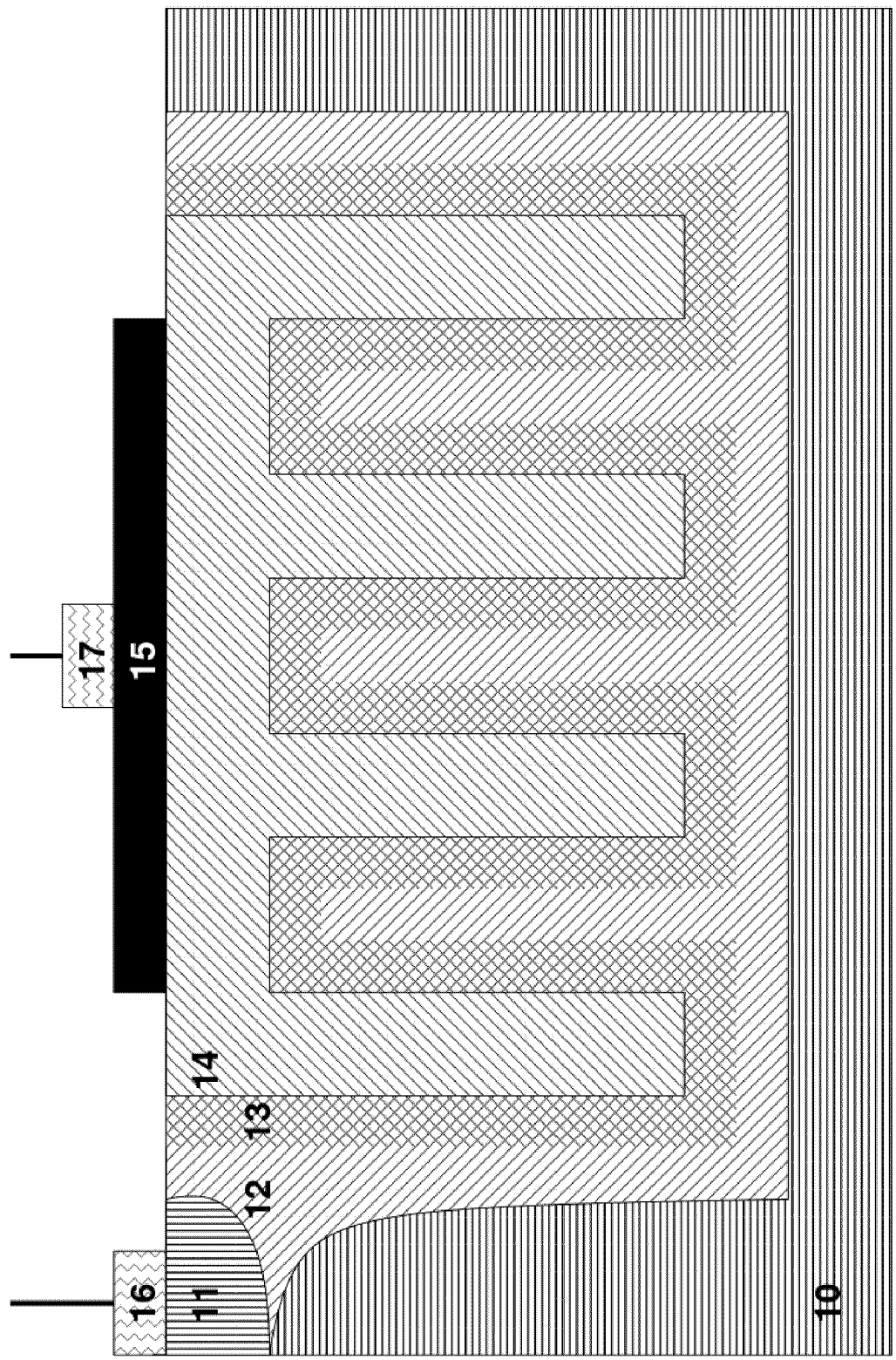
FIG. 1a shows a capacitor according to one embodiment.

In the following, the invention will be described with the help of examples. The examples given are in no way to be understood to be restrictions; rather, they simply serve to aid understanding of the invention, particularly by discussing different embodiment examples.

The invention consists in capacitors comprising porous semiconductors, in particular porous silicon (hereinafter: PSi), but also other porous semiconductors such as compound semiconductors like SiC, GaN and GaAlN, for example.

Such porous semiconductors can be obtained from monocrystalline solid material using known methods, for example electrochemically, and initially behave in an electrically almost insulating manner. This can be rectified by way of post-doping, for example post-doping from the gas phase in connection with a heat treatment, wherein the post-doping can be carried out until the degeneracy of the semiconductor. Alternatively or additionally to post-doping, the active surface of the porous semiconductor can be coated with an electric or electronic conductor.

An n-doped first porous semiconductor, for example, is infiltrated by at least one second electric conductor, wherein semiconductors, ionic liquids, inorganic semiconductors and here in particular electrically conductive (conjugated) polymers are also preferably—but not necessarily—suitable for this second electric conductor, for example polypyrrole or PEDOT electrochemically p-doped with perchlorate from $LiClO_4$ or tosylate anions, and in particular PEDOT:PSS. Here, infiltration means the penetration of the second electric conductor into pores of the first porous semiconductor. The person skilled in the art knows that porous silicon comprises so-called ridges, for example. The region between these ridges forms a pore into which the second electric conductor penetrates.

It is important that a non-ohmic electrical contact, for example having a non-linear current-voltage characteristic, in particular at least one heterocontact, is formed between the first semiconductor (or the conductive coating thereof) and the second conductor, i.e. that between the porous semiconductor and the infiltrate thereof a potential barrier is formed between the two conductors, and therefore a kind of diode, as a result of the diffusion of free charge carriers until the Fermi levels of the different conductors (first semiconductor and second electric conductor) are aligned.

Even such simple arrangements are suitable as capacitive energy storage devices, wherein specific capacitances are achieved in the forward mode of the diode, which are comparable to those of double-layer capacitors; the charging voltage needs to be limited to values that are significantly lower in magnitude than the knee voltage of the diode, however, since otherwise the leakage resistance of the capacitor (i.e. the diode capacitance) assumes very small values and the leakage current escalates accordingly. In addition, there is the very pronounced dependence of the diode capacitance on the charging voltage; a diode formed as described and operated forwards can exhibit very high capacitances at relatively small permissible charging voltages.

The use of such a diode as a capacitor is also possible in cut-off mode, wherein much higher charging voltages can be achieved than in forward mode, without the leakage current having to escalate. However, the capacitances of such diodes that can be shown in cut-off mode also tend to be lower than those in forward mode (with an external voltage of the same magnitude). If, for example, the infiltrated porous "first" semiconductor is not degenerated but sufficiently lightly doped, extraordinary or pronounced varactor behaviour can be achieved: Since in cut-off mode the conductivity of the pore walls collapses due to the expansion of the depletion zone in the pore walls of the porous semiconductor, the effective active surface of the capacitor structure and therefore the capacitance thereof also collapses. If this collapse of the capacitance can be achieved in cut-off mode with a voltage which is smaller than the breakdown voltage of the diode, a capacitor according to the invention can be used as the varactor, i.e. as the capacitance diode, for generating extremely steep-edged electrical pulses (e.g. by switched charging of the "diode in cut-off mode" via an inductor). Here, an electrical pulse is to be considered to have an extremely steep edge if it has a higher edge steepness than is achieved with conventional capacitance diodes. Compared to conventional varactors, varactors according to the invention are also able to store considerably more energy with the same component size.

By introducing a passivated layer, namely a dielectric, between the first and second semiconductors, the electric behaviour of the structure described above (of a first porous semiconductor infiltrated by a second conductor or semiconductor, wherein optionally both semiconductors are ohmically contacted) can be drastically improved in terms of leakage resistance, electric strength and linearity for use as a fixed capacitor/capacitance. This layer should be selected so as, inter alio, to be as good an insulator as possible, and in particular to have as large a band gap as possible, preferably with simultaneously high permittivity, preferably as high an effective mass of the charge carriers in the dielectric as possible, and more preferably as high a band gap as possible (1) between the power band of the dielectric and the Fermi edge at the ensemble of any electron conductors involved (metals as well as degenerate and non-degenerate n-conductors) and (2) between the valence band of the dielectric and the Fermi edge at the ensemble of any p-conductors involved, wherein the respective band gaps (1) and/or (2) should preferably be greater than 0.3 eV and particularly preferably greater than 1 eV in magnitude. Furthermore, the dielectric should be as free as possible from electrically active defects.

First Embodiment Example

A simple capacitor of this kind can be created by first producing mesoporous n-PSi by way of anodisation using known methods. Next, the n-PSi is post-doped (n-doping) from the gas phase and is then partially surface-oxidised to form conformal a-$SiO_2$, for example thermally in an oxygen-containing atmosphere, or anodically. The body thereby obtained of n-type n-PSi coated (passivated) with amorphous $SiO_2$ having as constant a thickness as possible ("conformal") is then filled with the conjugated polymer and optionally itself doped (here: oxidised), wherein known methods (chemical or anodic oxidation, optionally also polymerisation at the same time) can be used. Finally, the n-PSi and the p-type polymer (p-poly) can each be provided with ohmic contacts. Such capacitors are naturally polar; non-polar configurations can be obtained by way of anti-serial arrangements (e.g. Al/n-Si/n-PSi/$SiO_2$/p-poly/$SiO_2$/n-PSi/n-Si/Al or an alternative discrete anti-serial circuit). $SiO_2$ stands out as a dielectric which, as a high potential barrier, can reduce here the tunnel current appearing as a leakage current by way of its exceptionally high band gap of approximately 8.9 eV, high effective mass of the charge carriers and pronounced Fermi level unpinning at the interface of n-Si/a-$SiO_2$. However, the relative permittivity thereof, at $\varepsilon_r \approx 3.9$, is comparatively low. As an example, the aforementioned topology of a capacitor layer structure with contacting can be used:

Al/n-Si/n-PSi/a-$SiO_2$/p-poly/a-$SiO_2$/n-PSi/n-Si/Al.

Here, the topology in the filtration region (see region 13 in FIGS. 1*a* and 1*b*) is:

n-PSi/a-$SiO_2$/p-poly.

Between the Al and the n-Si an ohmic contact can easily be formed. Alternatively, instead of the aluminium, antimony alloys can be considered, for example, wherein antimony atoms acting as n-donors diffused into the substrate after a heat treatment lead to a local (n-)degeneracy of the n-silicon.

If the n-PSi is doped to degeneracy, and if the conductivity and charge carrier density of the polymer is also high, with a sufficiently thick a-$SiO_2$ the described topology acts as a large-surface plate capacitor with a-$SiO_2$ as the dielectric (strictly speaking as an anti-serial circuit of two of these). If the a-$SiO_2$ is omitted, a Schottky contact can be formed between the degenerate n-PSi (H-terminated, for example) and the p-polymer. However, its potential barrier SBH is fundamentally lower in magnitude than would be expected according to the Schottky-Mott rule, which is due to Fermi level pinning at the interfaces. Even as a very thin layer, the a-SiO$_2$ can effect Fermi level unpinning between the p-polymer and the n-PSi and therefore increase the SBH.

As the layer thickness of the a-SiO$_2$ increases, the electrical properties of the described structure (Al/n-Si/n-PSi/a-SiO$_2$/p-poly/a-SiO$_2$/n-PSi/n-Si/Al) gradually changes from those of two anti-serially connected varactor diodes with extremely high volume-specific capacitances but a low permissible operating voltage to a highly linear capacitor with a lower volume-specific capacitance, but with very low dielectric losses and a high permissible operating voltage where required.

Second Embodiment Example

Higher volume-specific capacitances can be achieved by replacing or supplementing the a-SiO$_2$ layer with a so-called high k dielectric. In particular—but not exclusively—the following can be used here: Si$_3$N$_4$, Al$_2$O$_3$, TiO$_2$, ZrO$_2$, HfO$_2$, Ta$_2$O$_5$, La$_2$O$_3$, Y$_2$O$_3$, Ta$_2$O$_5$ and silicates of the aforementioned oxides, and also the mixed oxides and oxynitrides thereof. When using degenerate n-PSi with a suitable mesostructure/porosity and sufficiently thick Ta$_2$O$_5$ layers, for example, a structure or topology with contacting Al/n-Si/n-PSi/a-Ta$_2$O$_5$/p-poly/C$_{graphite}$/Ag (with graphite and silver for ohmically contacting the p-type polymer) can have the properties of a conventional polymer tantalum capacitor, with greatly reduced use of Ta, since the metallic Ta in the structure is replaced by degenerate n-PSi—and can be integrated into chips. The a-Ta$_2$O$_5$ layer can be obtained in different ways, for example by way of electrochemical deposition of metallic tantalum and its subsequent anodisation or even by way of atomic layer deposition. What is disturbing here, however, is the possible overlap between the conduction band of a-Ta$_2$O$_5$ and the Fermi edge of the degenerate n-PSi (small band gap, see above). To avoid this problem, an incomplete anodisation of previously electrochemically deposited tantalum can be carried out, such that a Ta layer remains as the substrate for the grown a-Ta$_2$O$_5$, as a result of which it is possible to get very close to a conventional Ta polymer capacitor in terms of electrical behaviour—with the difference that it can easily be integrated into a monolithic chip. Replacing the p-poly with manganese dioxide (MnO$_2$) facilitates in an equivalent manner the integration of a conventional "dry" tantalum capacitor into a monolithic chip. The filling of the pores with the MnO$_2$ can be carried out in the known way, by infiltration with molten Mn(NO$_3$)2*6H$_2$O, and the pyrolysis thereof, a process which may have to be repeated several times.

Third Embodiment Example

The invention will be described in the following on the basis of a third embodiment example with the help of FIGS. 1$a$ and 1$b$:

FIG. 1$a$ symbolically shows a section through a capacitor according to the invention in a wafer. Region 10 is intrinsic silicon, region 11 is degenerate silicon, region 12 is n+ silicon (highly doped but not degenerate), region 13 is post-doped, n-type PSi, infiltrated with p-doped PPy (preferably electrochemically doped with LiClO$_4$ as the conducting salt) or PEDOT:PSS, region 14 consists of the aforementioned p-type polymer, region 15 is a graphite layer for ohmically contacting the polymer, region 17 is silver for contacting the graphite with an indicated supply line, region 16 is aluminium for ohmically contacting region 12 via the degenerate region 11, also with an indicated supply line.

FIG. 1$b$ symbolically shows a section of the layer structure in the boundary region between layer 13 and 14 in FIG. 1$a$; on the porous silicon 12, post-doped, n-type PSi is in galvanic contact with the n-type "bulk" n+ Si corresponding to region 12 from FIG. 1$a$; in FIG. 1$b$ the reference number 12 is therefore in the middle of a pore wall and forms a so-called ridge, which are typically 0.1 to 1 mm long and protrude from the n-type "bulk" n+ Si. A pore is formed here between this ridge and an adjacent ridge (not shown). Layer 18 is a layer of a-SiO$_2$, obtained for example by way of anodisation, thermal oxidation or atomic layer deposition, which is as uniform as possible in its thickness and the average thickness thereof is 1 nm, for example. Region 19 symbolises a layer of one or more of the aforementioned so-called high k dielectrics, such as a-Al$_2$O$_3$, ZrO$_2$, HfO$_2$ or LaAlO$_3$, and has an average thickness of 4 nm, for example. With reference number 14, the p-type polymer filling the pores here (between two ridges) is shown in FIG. 1$b$. Crucial to the core of the invention is FIG. 1$b$, while FIG. 1$a$ merely shows one possible implementation (with external contacting).

Additional Considerations and Embodiments of the Invention

The possible ionic conductivities of the materials involved constitute a further aspect of the invention. If, for example, an ion-conducting dielectric is selected, Helmholtz layers can be formed inside the dielectric and the component may have high pseudo capacitances and/or even behave like a rechargeable battery. If, on the other hand, a semiconductor involved, for example a conjugated polymer, is sufficiently ion-conductive, in cut-off mode the formation of an electrochemical double layer in the polymer can inhibit the formation of an expanded space-charge region (depletion zone), as a result of which the "capacitance loss" in cut-off mode can be compensated for or even over-compensated for. In particular, lithium ion-conducting conjugated polymers can be considered here.

A particularly interesting aspect of the invention is that in cut-off mode a space-charge region formed in the semiconductor(s) is capable of compensating for the defects or unevenness of a dielectric, so that the dielectric can be optimally utilised.

Finally, various systems will be listed and explained to aid understanding of the invention.

Fourth Embodiment Example

The topology in the filtration region is given here by:
n-PSi/SiO$_2$/p-PPy, n-PSi/SiO$_2$/PEDOT:PSS These systems exploit the high potential barrier between n-PSi and the aforementioned p-type polymers; the SiO$_2$ on the one hand causes the potential barrier to approach the theoretical value (Fermi level unpinning), and on the other hand, it reduces the leakage current as an effective tunnel barrier. In the case of very thin SiO$_2$ layers, for example in the region of 0.25 to 2 nm, a considerable part of the electrostatic potential drops not in the dielectric but in the space-charge region(s) in the semiconductors (n-PSi on the one hand, p-type polymer on the other). On the one hand, this leads to a pronounced non-linear behaviour of the capacitance depending on the charging voltage as well as a comparatively small permissible charging voltage; on the other hand, the aforementioned systems are comparatively simple to create, the achievable specific capacitance is high and the achievable ESR (electrical series resistance) is very low.

Fifth Embodiment Example

The topology in the filtration region is given here by:
n-PSi/SiO$_2$/Al$_2$O$_3$/p-PPy, n-PSi/SiO$_2$/Al$_2$O$_3$/PEDOT:PSS, n-PSi/SiO$_2$/Al$_2$O$_3$/p-Si(amorph)/Au These systems exploit the fact that the atomic layer deposition of amorphous aluminium oxide is excellent and aluminium oxide as a-Al$_2$O$_3$ has a relative dielectric constant twice as high as that of a-SiO$_2$ with a band gap that is almost the same size. The latter system, in which p-doped amorphous silicon infiltrates the pores of the n-PSi, has a particularly high temperature resistance. Moreover, while the Au easily forms an ohmic contact with the p-Si(amorphous), it forms a rectifying Schottky-type MIS contact with the other constituents, which is why it is mentioned separately here—even though in the present example it is mainly used for ohmic contacting.

Sixth Embodiment Example

The topology in the filtration region is given here by:
p-PSi/SiO$_2$/TiO$_2$/PEDOT:PSS This system uses the high relative dielectric constant of the TiO$_2$ and its property in order to form a high tunnel barrier for electron holes.

Seventh Embodiment Example

The topology in the filtration region is given here by:
n-PSi:H/ionic liquid/p-PSi:H, n-PSi/TiN/ionic liquid/TiN/n-PSi, n-PSi/ZrN/ionic liquid/ZrN/n-PSi The post-doping of the porous silicon can in each case be carried out until degeneracy.

Instead of a conjugated polymer, these systems rather use a so-called "ionic liquid", and preferably one with a melting point or melting range (what is important is the liquid temperature) sufficiently low for the respective environmental conditions and as high an (ionic) electric conductivity as possible, which in this case means a specific electric conductivity of at least 2 mS/cm and more preferably more than 10 mS/cm and more preferably still more than 20 mS/cm at room temperature, and as high a potential window as possible, which in this case means a potential window of at least 4.1 V and more preferably more than 5 V and more preferably still more than 5.5 V. Compared to capacitors according to the invention, which only contain electronic conductors, the internal resistance is increased, but extraordinarily high energy densities are achieved (low effective "plate spacing" of the electrochemical double layer→high capacitance, broad potential window→high operating voltage), and extremely low leakage currents can be achieved. Such capacitors are therefore particularly suitable for providing power for maintaining the memory content of RAM components of different types. The aforementioned systems constitute a substantial improvement over those proposed by VTT. Here, 1-ethyl-3-methylimidazolium-dicyanamide (EMI-DCA) is very well suited as the ionic liquid. If ionic liquids are used in capacitors according to the invention to fill the pores, these can preferably be gelled in with the help of electrochemically sufficiently stable polymers. An intermediate form between the aforementioned systems, in which the pores of the semiconductor are either filled with a semi-conductive and in particular p-type polymer or ionic liquid, results when the ionic liquid is gelled therein by suspending a conjugated and in particular p-type polymer. Such gels can optionally be obtained by way of anodic polymerisation of suitable ionic liquids in situ, for example.

Further Remarks on Implementation:

In the aforementioned systems, which contain a p-type conjugated polymer as a component and here in particular p-PPy, oxidised PEDOT, PEDOT:PSS, the polymer can in principle be replaced by a metal with a high work function, which leads to particularly low internal resistances with increased leakage resistances, however, and a comparatively low permissible operating voltage. Particularly suitable are gold and platinum as well as the alloys thereof, which can easily be deposited directly into the pores via chemical vapour deposition using known methods; contacting is trivial.

In the case of the anti-serial arrangement described above of two capacitors according to the invention exhibiting diode behaviour, a centre tap can also be provided when integrating the two components into a monolithic chip. This allows, in each case optionally:

the generation of a particularly high capacitance, by both capacitors being operated in parallel and in the conducting direction;

the generation of a high capacitance, by only one of the two capacitors being operated, in the conducting direction;

a particularly linear behaviour over a comparatively high voltage region in anti-serial operation;

varactor behaviour with a high initial capacitance when operating only one of the two capacitors in cut-off mode;

varactor behaviour with a particularly high initial capacitance when operating the two capacitors in parallel in cut-off mode.

Method for Producing Capacitors According to the Invention:

In the following, a method for producing capacitors according to the invention will be described by way of example; the description is in no way to be understood to be restrictive.

Figure 1B:
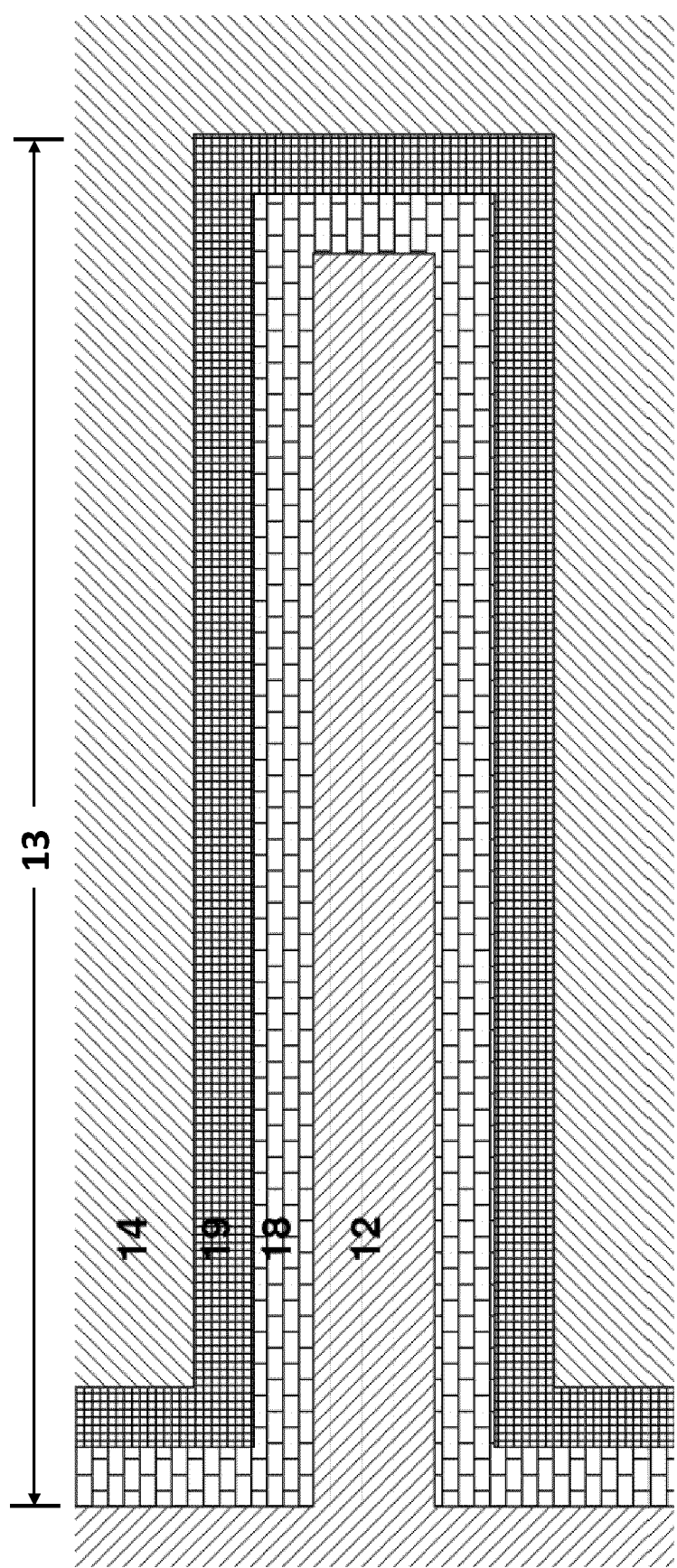
FIG. 1b shows a layer structure in a capacitor according to one embodiment.

To produce a corresponding capacitor, a trench structure can first be created by way of deep reactive ion etching of intrinsic silicon, as shown in FIG. 1a (masking steps etc., which are obvious to person skilled in the art, are not explained). Then, the trench structure is n-doped from the gas phase, for example, as a result of which the n+ type region 12 shown in FIG. 1a is also created. Subsequent etching (chemical or electrochemical) converts the surface up to a certain etch depth into the porous region (PSi) 13, which initially has electrically almost insulating properties (at least in the dark). Next, the PSi is dried, preferably by way of supercritical drying, and then post-doped (n-type) from the gas phase, for example. Then, a first dielectric layer of a-SiO$_2$, which is as uniform as possible, is applied to the pore walls of the n-PSi by way of anodic or thermal oxidisation or by way of CVD methods such as atomic layer deposition. After that, a second dielectric layer which is as uniform as possible can be applied to the first, in particular by means of atomic layer deposition and preferably selected from the group of the aforementioned high k dielectrics (and in particular a-Al$_2$O$_3$ or ZrO$_2$).

The pores are then filled. (Filling with p-PPy can optionally be carried out by way of anodic polarisation of pyrrole; in this case, degeneracy of the "bulk" silicon in the region of the pore bottoms (as a result of post-doping), which can be easily brought about by way of appropriate process control, can be exploited, but the associated Faraday current in the region of the pore bottoms must be passed through the dielectric). It is also possible to fill the dielectric-coated pores by way of dipping/drying with PEDOT:PSS with commercially available oligomeric suspensions; this also offers the advantage of the high temperature stability of PEDOT:PSS, which can ultimately simplify or even make possible in the first place the safe, simple, non-destructive soldering of corresponding components, especially with higher-melting tin-free solders.

A pore size that is as uniform as possible is desirable for the porous semiconductor.

The invention claimed is:

1. A capacitor comprising:
   a first porous semiconductor having a plurality of pores having an average pore size of between 20 nm and 200 nm;
   at least one electric conductor; and
   at least a portion of the first porous semiconductor being in contact with at least a portion of the at least one electric conductor via a heterocontact with a potential barrier,
   wherein the at least one electric conductor infiltrates the plurality of pores of the first porous semiconductor, and materials used to form the first porous semiconductor and/or the at least one electric conductor are selected such that the heterocontact is formed without applying an external voltage, as a result of diffusion of charge carriers, which is more than 0.5 V.

2. The capacitor according to claim 1, wherein the first porous semiconductor comprises porous silicon.

3. The capacitor according to claim 2, wherein the porous silicon has H-terminated surfaces.

4. The capacitor according to claim 1, wherein between the first porous semiconductor and the at least one electric conductor, a dielectric layer is arranged, an average thickness of the dielectric layer being between 0.25 nm and 25 nm.

5. The capacitor according to claim 4, wherein the dielectric layer comprises $SiO_2$.

6. The capacitor according to claim 4, wherein the dielectric layer comprises a high κ dielectric selected from a group consisting of $Si_3N_4$, $Al_2O_3$, $TiO_2$, $ZrO_2$, $HfO_2$, $La_2O_3$, $Y_2O_3$, $Ta_2O_5$ and silicates of aforementioned oxides and/or mixed oxides and oxynitrides thereof.

7. The capacitor according to claim 5, wherein the dielectric layer has a multilayer structure and comprises a first layer of amorphous $SiO_2$ and a second layer of one or more high κ dielectrics, wherein the first layer of amorphous $SiO_2$ is applied to the first porous semiconductor and has an average thickness of 0.25 nm to 1.5 nm and the second layer of the one or more high κ dielectrics, is applied to the first layer of amorphous $SiO_2$, wherein an average overall thickness of the dielectric layer is between 3 nm and 10 nm.

8. The capacitor according to claim 5, wherein the dielectric layer has a multilayer structure and comprises a first layer with an average thickness between 0.25 nm and 0.5 nm.

9. The capacitor according to claim 1, wherein the at least one electric conductor is p-doped amorphous silicon.

10. The capacitor according to claim 1, wherein the at least one electric conductor contains a p-doped conjugated organic polymer.

11. The capacitor according to claim 1, wherein an ionic liquid, a gelled ionic liquid, an ionic liquid gelled with a conjugated polymer or one or more noble metals function as the at least one electric conductor.

12. The capacitor according to claim 1, further comprising at least one means for increasing an electrical conductivity of a porous structure formed by the first porous semiconductor.

13. The capacitor according to claim 12, wherein the at least one means for increasing the electrical conductivity of the porous structure formed by the first porous semiconductor comprises additional impurity atoms in the first porous semiconductor.

14. The capacitor according to claim 12, wherein the at least one means for increasing the conductivity of the porous structure formed by the first porous semiconductor is configured in such a way that an electrically conductive layer is applied to the porous structure.

15. A monolithic circuit having one or more capacitors according to claim 1.

* * * * *